US010381407B2

(12) United States Patent
Kim et al.

(10) Patent No.: US 10,381,407 B2
(45) Date of Patent: Aug. 13, 2019

(54) SWITCH AND METHOD FOR FABRICATING THE SAME, AND RESISTIVE MEMORY CELL AND ELECTRONIC DEVICE, INCLUDING THE SAME

(71) Applicant: SK hynix Inc., Icheon (KR)

(72) Inventors: Beom Yong Kim, Suwon (KR); Soo Gil Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 15/432,806

(22) Filed: Feb. 14, 2017

(65) Prior Publication Data

US 2017/0365640 A1 Dec. 21, 2017

(30) Foreign Application Priority Data

Jun. 15, 2016 (KR) .................. 10-2016-0074641

(51) Int. Cl.
| | | |
|---|---|---|
| *H01G 2/00* | (2006.01) | |
| *G11C 11/28* | (2006.01) | |
| *H01L 27/24* | (2006.01) | |
| *H01L 45/00* | (2006.01) | |
| *H01L 21/8238* | (2006.01) | |

(52) U.S. Cl.
CPC .......... *H01L 27/2418* (2013.01); *G11C 11/28* (2013.01); *H01L 45/065* (2013.01); *H01L 45/085* (2013.01); *H01L 45/1233* (2013.01); *H01L 45/1253* (2013.01); *H01L 45/141* (2013.01); *H01L 45/146* (2013.01); *H01L 45/147* (2013.01); *H01G 2/00* (2013.01); *H01L 21/823807* (2013.01)

(58) Field of Classification Search
CPC . H01L 27/2418; H01L 45/065; H01L 45/085; H01L 45/1233; H01L 45/1253; H01L 45/141; H01L 45/146; H01L 45/147; H01L 21/823807; G11C 11/28; H01G 2/00
USPC ............................................ 257/4
See application file for complete search history.

(56) References Cited

U.S. PATENT DOCUMENTS

| | | |
|---|---|---|
| 6,780,753 B2 | 8/2004 | Latchford et al. |
| 8,679,988 B2 | 3/2014 | Lee et al. |
| 8,829,532 B2 | 9/2014 | Murphy et al. |
| 9,012,878 B1 | 4/2015 | Mathur |
| 9,041,129 B2 | 5/2015 | Ho et al. |
| 2014/0332870 A1* | 11/2014 | Park ...................... H01L 29/45 257/295 |

(Continued)

FOREIGN PATENT DOCUMENTS

KR    10-2013-0112607 A    10/2013

OTHER PUBLICATIONS

NPL Machine Translation KO 10-2013-0112607.*

(Continued)

*Primary Examiner* — Frederick B Hargrove
*Assistant Examiner* — Patricia D Reddington

(57) ABSTRACT

A switch includes a first electrode layer, a second electrode layer disposed over the first electrode layer, and a selecting element layer interposed between the first electrode layer and the second electrode layer. The selecting element layer includes a gas region in which a current flows or does not flow according to a voltage applied to the switch. When the current flows, the switch is in an on-state, and, when the current does not flow, the switch is in an off-state.

22 Claims, 13 Drawing Sheets

(56) References Cited

U.S. PATENT DOCUMENTS

2017/0047513 A1\* 2/2017 Rolandi ............. G11C 13/0014
2017/0271583 A1\* 9/2017 Majhi .................. H01L 45/122

OTHER PUBLICATIONS

Chiahua Ho et al., "Threshold Vacuum Switch (TVS) on 3D-Stackable and $4F^2$ Cross-Point Bipolar and Unipolar Resistive Random Access Memory", 2012, pp. 2.8.1-2.8.4, IEEE.

\* cited by examiner

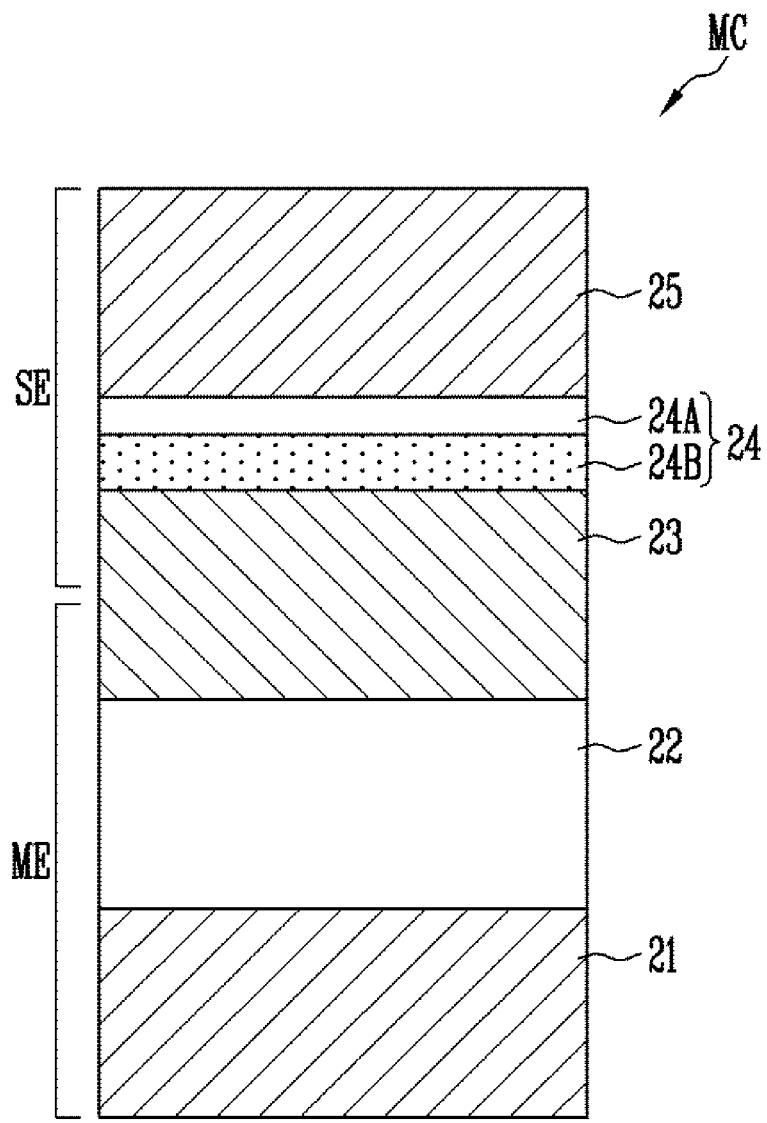

SWITCH AND METHOD FOR FABRICATING THE SAME, AND RESISTIVE MEMORY CELL AND ELECTRONIC DEVICE, INCLUDING THE SAME

CROSS-REFERENCE TO RELATED APPLICATION

The present application claims priority under 35 U.S.C. § 119(a) to Korean patent application number 10-2016-0074641 filed on Jun. 15, 2016, which is incorporated herein in its entirety by reference.

BACKGROUND

1. Field

Embodiments of the present disclosure relate to a memory circuit or device, and an application thereof in an electronic device.

2. Description of the Related Art

In recent years, semiconductor devices capable of storing information in various electronic devices such as portable communication devices become desirable according to miniaturization, low power, high performance, and diversification of the electronic devices, and studies on the semiconductor devices have been actively conducted.

Such semiconductor devices include semiconductor devices which can store data using a characteristic that switches between different resistant states according to a voltage or a current applied thereto, for example, a resistive random access memory (RRAM), a phase-change random access memory (PRAM), a ferroelectric random access memory (FRAM), a magnetic random access memory (MRAM), an E-fuse, etc.

SUMMARY

Embodiments provide a switch having improved characteristics and a method for fabricating the same, and a resistive memory and an electronic device, including the same.

According to an embodiment of the present disclosure, there is provided a switch including: a first electrode layer; a second electrode layer disposed over the first electrode layer; and a selecting element layer interposed between the first electrode layer and the second electrode layer, the selecting element layer including a gas region with a plurality of gas ions in which a current flows or is does not flow according a value of a voltage applied to the switch, wherein the current flows across the gas region in an on-state, and the current does not flow across the gas region in an off-state.

According to an embodiment of the present disclosure, there is provided a resistive memory cell including: a first electrode layer; a second electrode layer disposed over the first electrode layer; a third electrode layer disposed over the second electrode layer; a variable resistance layer interposed between the first electrode layer and the second electrode layer; and a selecting element layer interposed between the second electrode layer and the third electrode layer, the selecting element layer including a gas region with a plurality of gas ions in which a current flows or does not flow according to a voltage applied to the second and third electrode layers, wherein, if the voltage is less than a threshold value, current does not flow through the selecting element layer into the variable resistance layer, and, if the voltage is equal to or greater than the threshold value, the current flows through the selecting element layer into the variable resistance layer.

According to an embodiment of the present disclosure, there is provided an electronic device including: a memory element storing data; and a selecting element electrically connected to the memory element, the selecting element including a gas region in which a current flows or does not flow according to a value of a signal applied to the electronic device, the selecting element preventing the current from flowing to the memory element when the value is less than a threshold value, and allowing the current to flow to the memory element when the value is equal to or greater than the threshold value, thereby controlling access to the memory element.

According to an embodiment of the present disclosure, there is provided a method for fabricating a switch, the method including: forming a first electrode layer; forming a second electrode layer over the first electrode layer; and implanting ions between the first electrode layer and the second electrode layer to form a gas region in which a current flows or does not flow according to a voltage applied to the switch.

BRIEF DESCRIPTION OF THE DRAWINGS

Embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3A and 3B are a perspective view and a cross-sectional view, respectively, illustrating a resistive memory cell according to another embodiment of the present disclosure.

DETAILED DESCRIPTION

Figure 1A:
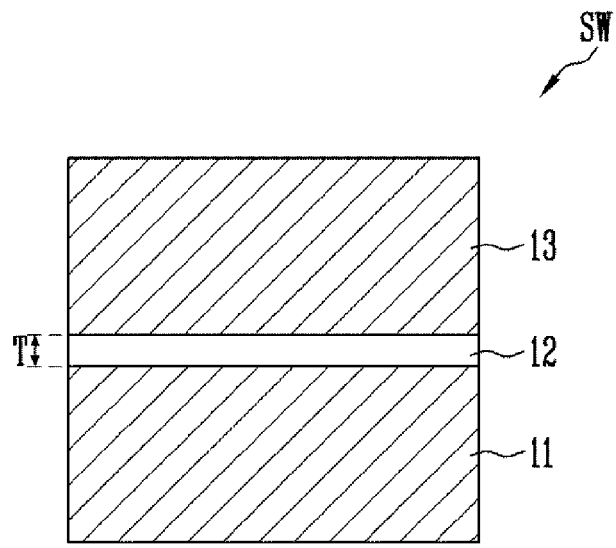
FIG. 1A is a cross-sectional view illustrating a switch according to an embodiment of the present disclosure.

Hereinafter, various embodiments will be described in detail with reference to the accompanying drawings.

The drawings are not necessarily drawn to scale, and, in some embodiments, at least some of structures shown in the drawings may be exaggerated to clearly describe features of the embodiments. When a multi-layered structure having two or more layers is disclosed in a drawing or detailed description, the relative positional relationship or arrangement order of the layers merely reflects a specific embodiment, and thus, embodiments of the present disclosure are not limited thereto. The relative positional relationship or arrangement order of the layers may be changed. Also, the drawing or detailed description of the multi-layered structure may not reflect all layers existing in a specific multi-layered structure (e.g., one or more additional layers may exist between two layers). For example, when a first layer exists on a second layer or a substrate in the multi-layered structure in the drawing or detailed description, the first layer can be directly formed on the second layer or the substrate. In addition, one or more other layers may exist between the first layer and the second layer or between the first layer and the substrate.

FIG. 1A is a cross-sectional view illustrating a switch SW according to an embodiment of the present disclosure.

Referring to FIG. 1A, the switch SW is a device that has an on-state or off-state, based on the value of a voltage or a current applied thereto. For example, when a voltage is applied to the switch SW and the value of the applied voltage is less than a threshold voltage, the switch SW is in the off-state. When the value of the applied voltage is equal to or greater than the threshold voltage, the switch SW is in the on-state. The switch SW includes a gas region (or a gas layer) with a plurality of gas ions. If a conductive path is generated in the gas region, the switch SW is in the on-state. If the conductive path disappears, the switch SW is in the off-state.

The switch SW includes a first electrode layer 11, a selecting element layer 12, and a second electrode layer 13. The first electrode layer 11 and the second electrode layer 13 are spaced apart from each other, and the selecting element layer 12 is interposed between the first electrode layer 11 and the second electrode layer 13. Here, the first electrode layer 11, the selecting element layer 12, and the second electrode layer 13 may be stacked in a first direction (e.g., a third direction III of FIG. 2A), which is a vertical direction with respect to a substrate. However, embodiments of the present disclosure are not limited thereto, and the first electrode layer 11, the selecting element layer 12, and the second electrode layer 13 may be stacked in a second direction (e.g., a first direction I or a second direction II of FIG. 2A), which is a horizontal direction with respect to the substrate.

The first and second electrode layers 11 and 13 are used to provide the selecting element layer 12 with a voltage or a current applied to the switch SW, and may be formed of a conductive material. The first and second electrode layers 11 and 13 may include metal, metal nitride, precious metal, etc. For example, the first and second electrode layers 11 and 13 may include any one of titanium (Ti), titanium nitride (TiN), tungsten (W), tungsten nitride (WNx), tantalum (Ta), tantalum nitride (TaN), aluminum (Al), copper (Cu), silver (Ag), platinum (Pt) and iridium (Ir), or a combination thereof.

The first and second electrode layers 11 and 13 may include the same metal, or may include different kinds of metals, respectively. As an example, if the first electrode layer 11 includes a precious metal, the second electrode layer 13 includes a general metal other than the precious metal of the first electrode layer 11. The precious metal may be gold (Au), silver (Ag), platinum (Pt), iridium (Ir), or palladium (Pd), and the general metal may be a metal element other than the precious metals. As another example, if the second electrode layer 13 includes a precious metal, the first electrode layer 11 includes a general metal instead of the precious metal of the second electrode layer 13.

The selecting element layer 12 has a switching characteristic, such that, when the value of the applied voltage or current is less than a threshold value, the selecting element layer 12 substantially cuts off a current, and, when the value of the applied voltage or current is equal to or greater than the threshold value, the selecting element layer 12 allows current to flow through the selecting element layer 12. Specifically, when the value of the applied voltage is less than a threshold value, the selecting element layer 12 substantially prevents the current from flowing through the selecting element layer 12. The selecting element layer 12 includes a gas region having the threshold switching characteristic, and the gas region may be located at an interface between the first electrode layer 11 and the second electrode layer 13.

When the value of a voltage applied to the switch SW is equal to or greater than the threshold value, a current flows through the gas region. For example, electrons are moved by direct tunneling in the gas region, or a conductive path is formed in the gas region. As a result, the current flows between the first electrode layer 11 and the second electrode layer 13. Thus, the switch SW is in the on-state, and the current flowing in the on-state is referred to as an on-current ($I_{on}$). In SW is less than the threshold value or when no voltage or current is applied to the switch SW, the direct tunneling does not occur in the gas region, and the conductive path is not formed. That is, the gas region substantially prevents a current from flowing through the gas region, and the gas region has a characteristic of a nonconductor. Therefore, the switch SW is in the off-state, and the current in the off-state is referred to as an off-current ($I_{off}$).

Here, the conductive path may be one or more conductive filaments. The conductive filaments may include conductive ions, which are moved into the gas region from the first electrode layer 11, from the second electrode layer 13, or from the first and second electrode layers 11 and 13. For example, if the first electrode layer 11 includes a precious metal such as platinum (Pt) or iridium (Ir) and the second electrode layer 13 includes a general metal such as titanium (Ti) or tungsten (W), ions of the general metal are moved into the gas region from the second electrode layer 13, thereby forming the conductive filaments.

Meanwhile, the gas region has a predetermined thickness T. The thickness T is determined, for example, by considering a size of the switch SW, material characteristics (e.g., melting points, diffusion concentrations, and diffusion coefficients into the gas region) of the first and second electrode layers 11 and 13, or the like. Specifically, the thickness T of the gas region may be increased as a value of the diffusion coefficient of the first electrode layer 11 or the second electrode layer 13 into the gas region increases. For example, the gas region may have a thickness T of 10 to 200 Å. When a current flows due to the direct tunneling, the thickness T of the gas region may be smaller compared with when the current flows due to the conductive filament.

The gas region may substantially entirely or partially exist at the interface between the first electrode layer 11 and the second electrode layer 13. As an example, the gas region may exist as a gas layer corresponding to the selecting element layer 12 at the interface between the first electrode layer 11 and the second electrode layer 13. In this case, the first electrode layer 11 and the second electrode layer 13 are completely separated from each other by the gas layer, and thus a current does not flow in the off-state. As another example, the gas region may be partially formed at the interface between the first electrode layer 11 and the second electrode layer 13. In other words, the gas region may be formed at a portion of the interface. In this case, an area of contact between the first electrode layer 11 and the second electrode layer 13 corresponds to the remaining portion at the interface. Also, a low off-current ($I_{off}$) having a small magnitude can flow through the gas region due to gas characteristics, and hence a total magnitude of a current flowing between the first electrode layer 11 and the second electrode layer 13 in the off-state can be limited.

According to the above-described embodiments, if the value of the applied voltage or current is equal to or greater than the threshold value, the current flows through the gas region. For example, when electrons are moved by direct tunneling in the gas region, or when a conductive path is formed in the gas region, current flows through the gas region. Thus, the switch SW is in the on-state. In an embodiment, a conductive filament is formed in the gas region, thereby forming a conductive path between the first electrode layer 11 and the second electrode layer 13. Conductive ions may be moved into the gas region from the first electrode layer 11, from the second electrode layer 13, or from the first and second electrode layers 11 and 13, thereby forming the conductive filament.

Figure 1B:
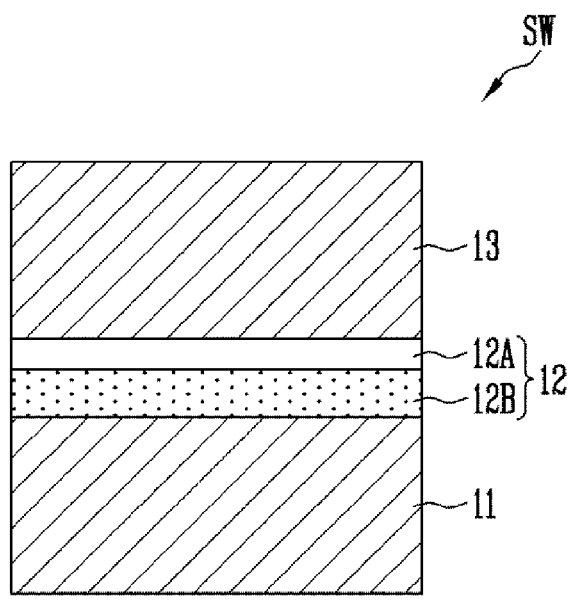
FIG. 1B is a cross-sectional view illustrating a switch according to another embodiment.

Referring to FIG. 1B, in a switch SW according to another embodiment of the present disclosure, a selecting element layer 12 includes a gas region (or a gas layer) 12A and an insulating layer 12B. The insulating layer 12B is interposed between the first electrode layer 11 and the second electrode layer 13, and the gas region 12A is located at an interface between the insulating layer 12B and the second electrode layer 13. For example, the insulating layer 12B may include an oxide, a nitride, or a combination thereof.

When the selecting element layer 12 includes the insulating layer 12B, a parasitic resistance of the switch SW may be adjusted. When a voltage applied to the switch SW gradually increases before reaching a threshold voltage, a magnitude of a current does not significantly increase. After the applied voltage reaches the threshold voltage, the current increases rapidly. In this case, a current-voltage curve of the switch SW may have a desirable shape according to an application of the switch SW, a type of a device in which the switch SW is disposed, etc. Such a desirable shape of the current-voltage curve may be obtained by adjusting a thickness of the insulating layer 12B. For example, a resistance value of the switch SW may be increased by increasing the thickness of the insulating layer 12B, or the resistance value of the switch SW may be decreased by decreasing the thickness of the insulating layer 12B. When the resistance value of the switch SW varies, a slope of the current-voltage curve may be adjusted to match the desirable shape.

When the gas region 12A partially exists in a portion of the interface between the first electrode layer 11 and the second electrode layer 13, due to the presence of the insulating layer 12B, it is possible to prevent the first electrode layer 11 and the second electrode layer 13 from directly contacting each other by the insulating layer 12B. That is, the first electrode layer 11 and the second electrode layer 13 can be insulated from each other by the insulating layer 12B.

According to the above-described embodiments, if the value of the applied voltage or current is equal to or greater than the threshold value, a conductive filament is formed in the gas region 12A, and a vacancy chain is formed in the insulating layer 12B, so that a conductive path is generated between the first electrode layer 11 and the second electrode layer 13. Thus, the switch SW is in the on-state. For example, conductive ions may be moved into the gas region 12A from the first electrode layer 11, from the second electrode layer 13, or from the first electrode layer 11 and the second electrode layer 13, thereby forming the conductive filament. Also, atoms may be moved in the insulating layer 12B, thereby forming vacancies, and the formed vacancies may be connected to each other, thereby forming the vacancy chain.

Figure 2A:
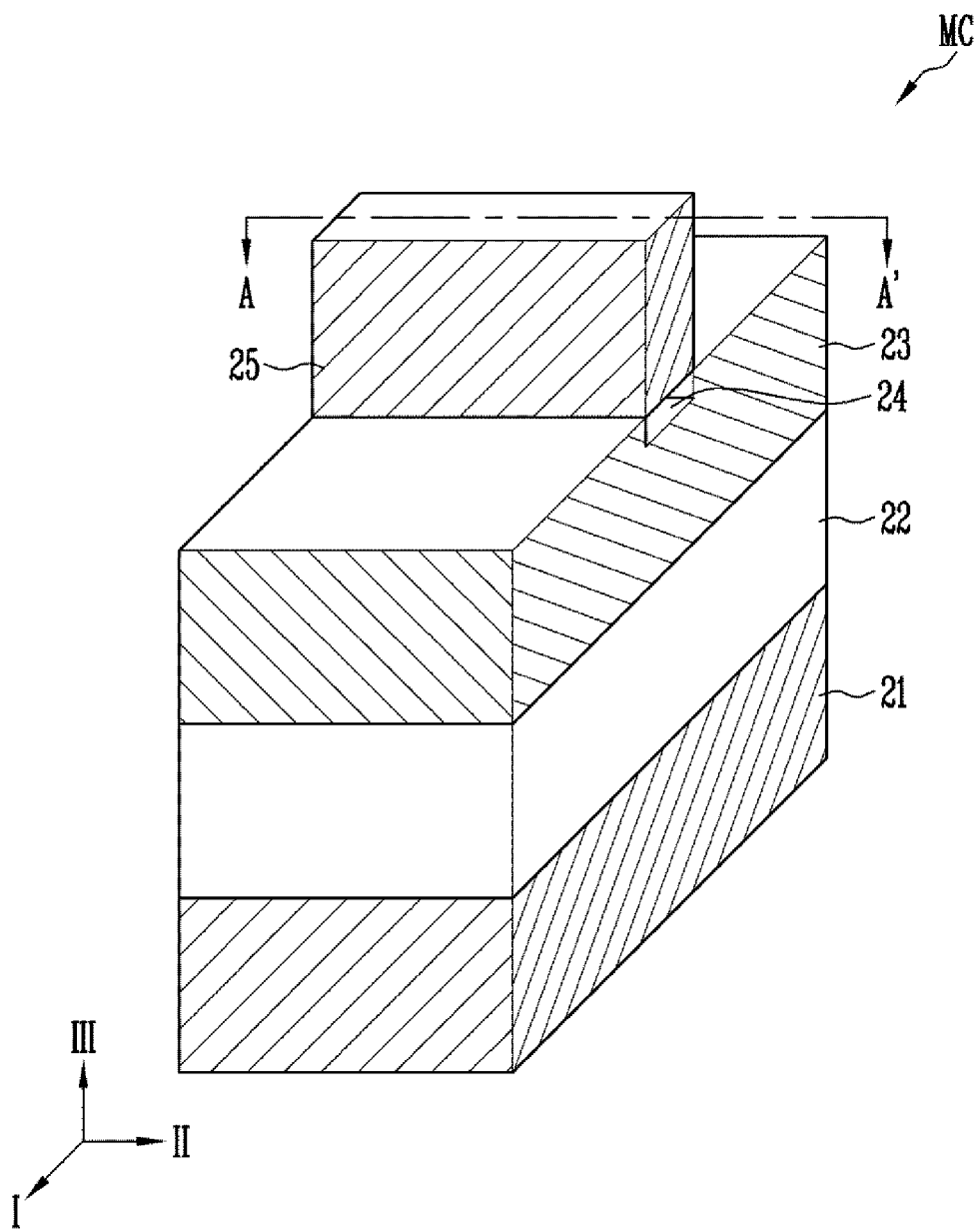
FIGS. 2A and 2B are a perspective view and a cross-sectional view, respectively, illustrating a resistive memory cell according to an embodiment of the present disclosure.
Figure 2B:
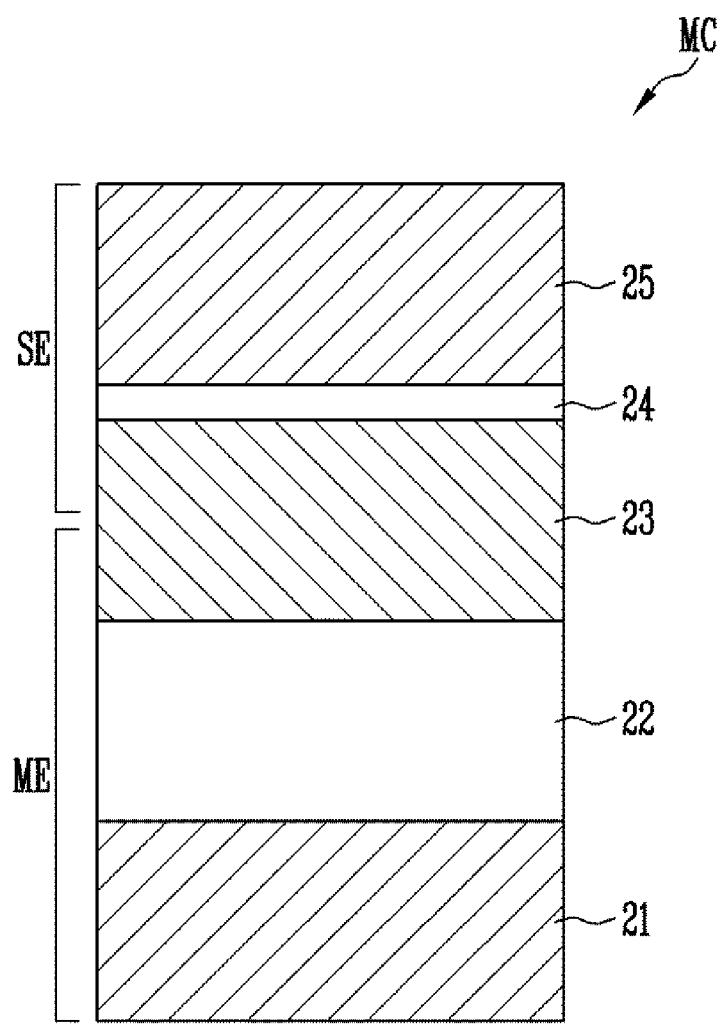

FIGS. 2A and 2B illustrate a resistive memory cell MC according to an embodiment of the present disclosure. FIG. 2A illustrates a perspective view and FIG. 2B illustrates a cross-sectional view taken along a line A-A' of FIG. 2A. Hereinafter, descriptions of a selecting element SE of the resistive memory cell MC similar to those of the switch of FIG. 1A will be omitted for the interest of brevity.

Referring to FIGS. 2A and 2B, the resistive memory cell MC includes a memory element ME storing data therein, and a selecting element SE electrically connected to the memory element ME and controlling access to the memory element ME. Here, the selecting element SE may be a switch.

The memory element ME may include a first electrode layer 21, a variable resistance layer 22, and a second electrode layer 23, and the selecting element SE may include the second electrode layer 23, a selecting element layer 24, and a third electrode layer 25. In this case, the first electrode layer 21 may be a lower electrode, the second electrode layer 23 may be a middle electrode, and the third electrode layer 25 may be an upper electrode. In addition, the memory element ME and the selecting element SE share the second electrode layer 23, e.g., the middle electrode. Here, the middle electrode may be a conductive path for electrically connecting the lower electrode to the upper electrode. Accordingly, it is possible to implement the resistive memory cell MC having a 1S1R structure.

For reference, in FIGS. 2A and 2B, the selecting element SE is located at an upper portion of the resistive memory cell MC and the memory element ME is located at a lower portion of the resistive memory cell MC, but embodiments of the present disclosure are not limited thereto. In another embodiment (not shown), the memory element ME may be located at the upper portion of the resistive memory cell MC and the selecting element SE may be located at the lower portion of the resistive memory cell MC. In addition, the selecting element SE and the memory element ME may be stacked in a first direction I, in a second direction II, or in a third direction III.

The first to third electrode layers 21, 23, and 25 are configured to provide the variable resistance layer 22 with a voltage or a current applied to the resistive memory cell MC, and may be formed of a conductive material. The first to third electrode layers 21, 23, and 25 may include metal, metal nitride, precious metal, etc. For example, the first to third electrode layers 21, 23, and 25 may include any one of titanium (Ti), titanium nitride (TiN), tungsten (W), tungsten nitride (WNx), tantalum (Ta), tantalum nitride (TaN), aluminum (Al), copper (Cu), silver (Ag), platinum (Pt) and iridium (Ir), or a combination thereof.

The second electrode layer 23 and the third electrode layer 25 may be formed of the same material, or may be formed of different materials. For example, the second electrode layer 23 and the third electrode layer 25 may be formed of different kinds of metals.

Here, the first electrode layer 21 may extend in the first direction I, and the third electrode layer 25 may extend in the second direction II intersecting the first direction I. The second electrode layer 23 may extend in the first direction I. In another embodiment, the second electrode layer 23 is patterned and the patterned second electrode (not shown) may be located at an intersection of the first electrode layer 21 and the third electrode layer 25. Also, the first to third electrode layers 21, 23, and 25 may be sequentially stacked in the third direction III intersecting the first and second directions I and II.

The variable resistance layer 22 may operate as a variable resistor switching between different resistance states based on the applied voltage or current. As an example, if a conductive path penetrating the variable resistance layer 22 is generated in the variable resistance layer 22, the variable resistance layer 22 is in a low-resistance state. Also, if the conductive path in the variable resistance layer 22 disappears, the variable resistance layer 22 is in a high-resistance state. As another example, when the variable resistance layer 22 includes a metal oxide containing oxygen vacancies, a conductive path according to behavior of the oxygen vacancies is generated or disappears in the variable resistance layer 22, and therefore, the resistance state of the variable resistance layer 22 may be changed. Accordingly, the variable resistance layer 22 can store data depending on a resistance state thereof. For example, if the variable resistance layer 22 has the high-resistance state, data indicative of a logic low value '0' is stored in the memory element ME. If the variable resistance layer 22 has the low-resistance state, data indicative of a logic high value '1' is stored in the memory element ME. In other embodiments, the conductive path may be formed in various manners according to the kind of the variable resistance layer 22, the structure of a layer, and operational characteristics.

Here, the variable resistance layer 22 may include various material used in a resistive random access memory (RRAM), a phase-change random access memory (PRAM), a ferroelectric random access memory (FRAM), a magnetic random access memory (MRAM), and the like. For example, the variable resistance layer 22 may include a transition metal oxide, a metal oxide such as a perovskite-based material, a phase change material such as a chalcogenide-based material, a ferroelectric material, a ferromagnetic material, and the like. Also, the variable resistance layer 22 may have a single-layered structure or a multi-layered structure.

The selecting element layer 24 may have a switching characteristic that, if the value of the applied voltage or current is less than a threshold value, the selecting element layer 24 substantially prevents current flowing through the selecting element layer 24, and, if the value of the applied voltage or current is equal to or greater than the threshold value, the selecting element layer 24 allows current to flow through the selecting element layer 24. When the selecting element layer 24 allows the current to flow, a magnitude of the flowing current rapidly increases with an increase in the applied voltage or current. Also, the selecting element layer 24 includes a gas region located at an interface between the second electrode layer 23 and the third electrode layer 25.

According to the above-described embodiment, when the selecting element SE is in an on-state to allow the current to flow, the current smoothly flows into the memory element ME. Thus, a predetermined write voltage or a predetermined read voltage is applied to the resistive memory cell MC, to store data in the variable resistance layer 22 or to read the stored data in the variable resistance layer 22. Here, the write voltage or the read voltage may have substantially the same level as or a higher level than a threshold voltage having a level sufficiently high to cause the selecting element SE to have the on-state.

Figure 3A:
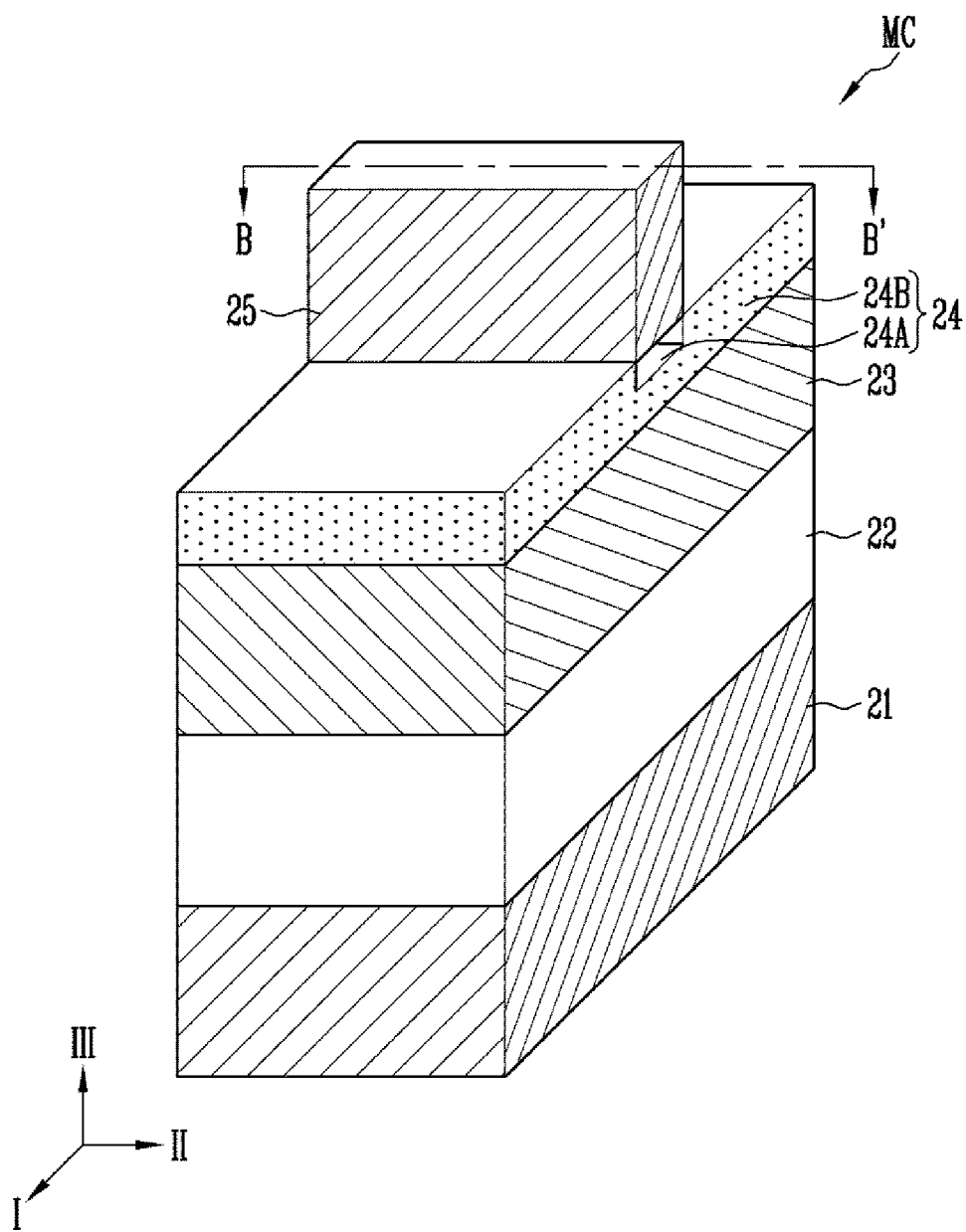

FIGS. 3A and 3B illustrate a resistive memory cell MC according to another embodiment of the present disclosure. FIG. 3A illustrates a perspective view and FIG. 3B illustrates a sectional view taken along a line B-B' of FIG. 3A. Hereinafter, descriptions of a selecting element SE of the resistive memory cell MC similar to those of the switch of FIG. 1B will be omitted for the interest of brevity.

Referring to FIGS. 3A and 3B, the resistive memory cell MC includes a memory element ME storing data therein, and the selecting element SE electrically connected to the memory element ME and controlling access to the memory element ME. Here, the selecting element SE includes a selecting element layer 24, the selecting element layer 24 includes a gas region (or a gas layer) 24A and an insulating layer 24B, and the gas region 24A is located at a boundary between the insulating layer 24B and a third electrode layer 25.

Figure 4A:
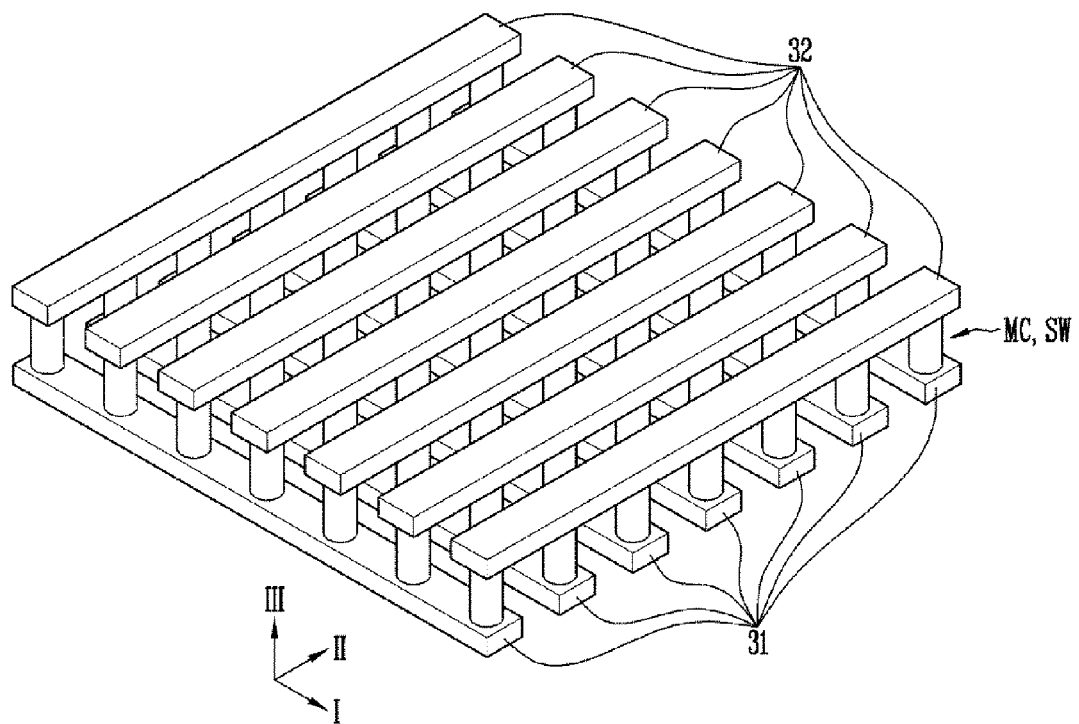
FIGS. 4A and 4B are perspective views illustrating an electronic device including cell arrays having a cross-point structure according to embodiments of the present disclosure.
Figure 4B:
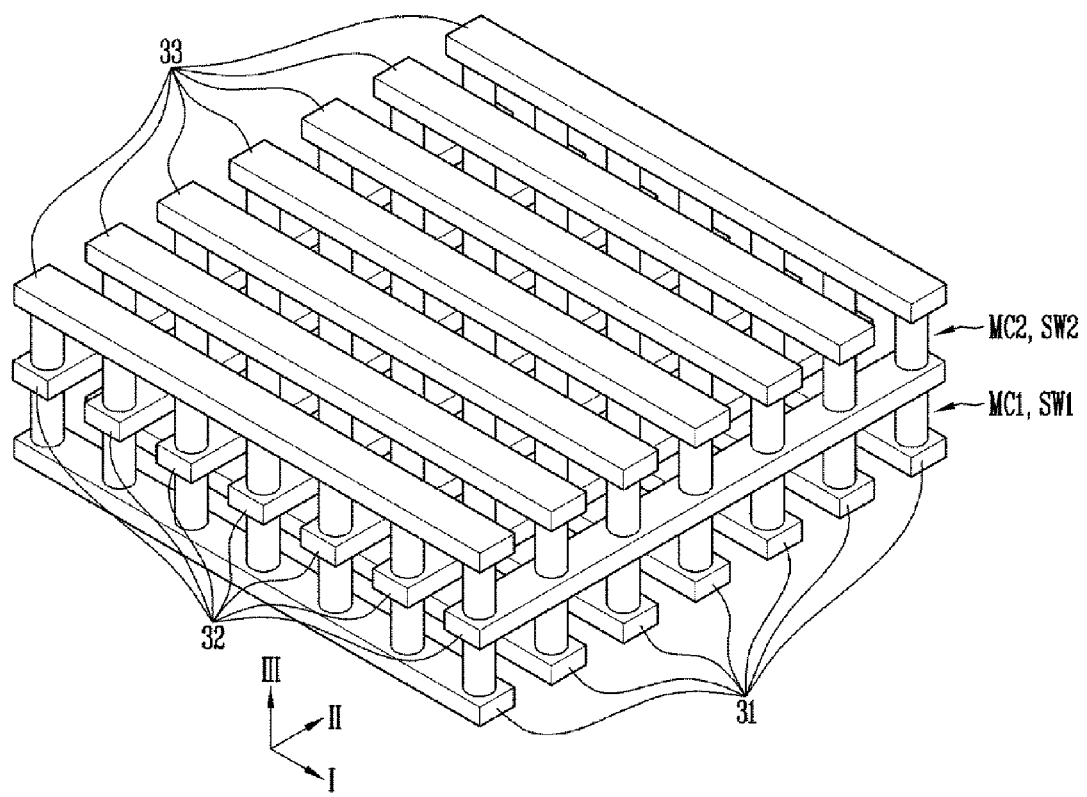

FIGS. 4A and 4B are perspective views illustrating an electronic device including cell arrays having a cross-point structure according to embodiments of the present disclosure.

Referring to FIG. 4A, a cell array according to an embodiment of the present disclosure includes first lines 31 extending in parallel with each other and in a first direction I and second lines 32 extending in parallel with each other and in a second direction II. Here, the first lines 31 may be located at a first level, and the second lines 32 may be located at a second level different from the first level. For example, the first lines 31 and the second lines 32 may be stacked in a third direction III, and the second lines 32 may be located over the first lines 31.

In addition, switches SW or resistive memory cells MC may be located at intersections of the first lines 31 and the second lines 32. The switches SW or the resistive memory cells MC are located between the first lines 31 and the second lines 32, and may be electrically connected to the first and second lines 31 and 32.

Here, the switches SW may have the structures described above with reference to FIGS. 1A and 1B, and the resistive memory cells MC may have the structures described above with reference to FIGS. 2A to 3B. For example, lower electrode layers (e.g., first electrode layers 21 of FIGS. 2B and 3B) of the resistive memory cells MC may be electrically connected to the first lines 31, and upper electrode layers (e.g., third electrode layers 25 of FIGS. 2B and 3B) of the resistive memory cells MC may be electrically connected to the second lines 32.

Referring to FIG. 4B, a cell array according to an embodiment of the present disclosure includes first lines 31 extending in parallel to each other and in first direction I, second lines 32 extending in parallel to each other and in second direction II, and third lines 33 extending in parallel to each other and in the first direction I. Here, the first lines 31 may be located at a first level, the second lines 32 may be located at a second level, and the third lines 33 may be located at a third level different from the first and second levels. For example, the first to third lines 31 to 33 may be sequentially stacked in the third direction III.

First switches SW1 or first resistive memory cells MC1 may be located at intersections of the first lines 31 and the second lines 32, and second switches SW2 or second resistive memory cells MC2 may be located at intersections of the second lines 32 and the third lines 33. The first switches SW1 or the first resistive memory cells MC1 may be located between the first lines 31 and the second lines 32, and the second switches SW2 or the second resistive memory cells MC2 may be located between the second lines 32 and the third lines 33. The first switches SW1 or the first resistive memory cells MC1 may be electrically connected to the first and second lines 31 and 32, and the second switches SW2 or the second resistive memory cells MC2 may be electrically connected to the second and third lines 32 and 33.

In addition, the first switches SW1 and the second switches SW2 may have the same structure, or may have structures symmetrical with respect to the second lines 32. Similarly, the first resistive memory cells MC1 and the second resistive memory cells MC2 may have the same structure, or may have structures symmetrical with respect to the second lines 32.

According to the above-described embodiments, resistive memory cells MC are stacked as a cell array having a cross-point structure, so that the degree of integration of a memory can be improved. Also, switches SW or selecting elements SE impede a current, so that it is possible to substantially prevent the leakage of a current of the resistive memory cells MC included in the cell array.

For example, when a first voltage having a first level V1 is applied to a resistive memory cell MC selected in the cell array at an intersection between a selected one of the first lines 31 and a selected one of the second lines 32, a second voltage having a second level V2 substantially equal to half of the first level V1 is applied to a plurality of unselected resistive memory cells sharing the selected one of the first lines 31 or the selected one of the second lines 32 with the selected resistive memory cell MC. Therefore, in order to prevent the leakage of a current through one or more of the unselected resistive memory cells, the switch SW or the selecting element SE substantially prevents current from flowing into a memory element ME when a voltage having a level equal to or smaller than the half of the first level V1 is applied to the unselected resistive memory cells. In other words, a material that has a low off-current ($I_{off}$) characteristic and a high on-current ($I_{on}$) characteristic is used for a selecting element layer of the switch SW or the selecting element SE. According to the embodiments of the present disclosure, the selecting element layer including a gas region is used, thereby preventing the leakage of current through the unselected resistive memory cells MC.

Figure 5A:
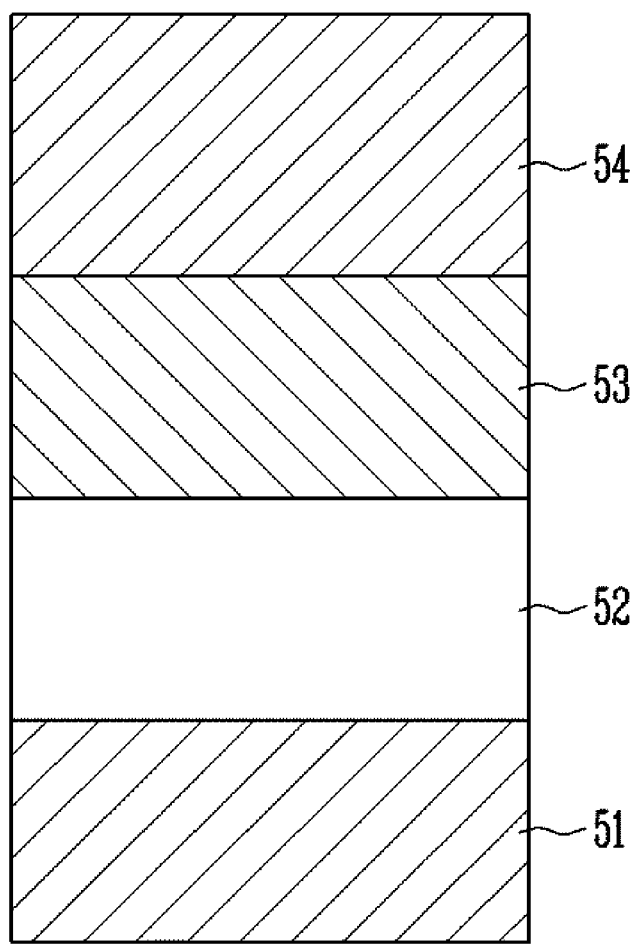
FIGS. 5A to 5C are cross-sectional views illustrating a method for fabricating the switch of FIG. 1A and the resistive memory cell of FIGS. 2A and 2B according to an embodiment of the present disclosure.
Figure 5B:
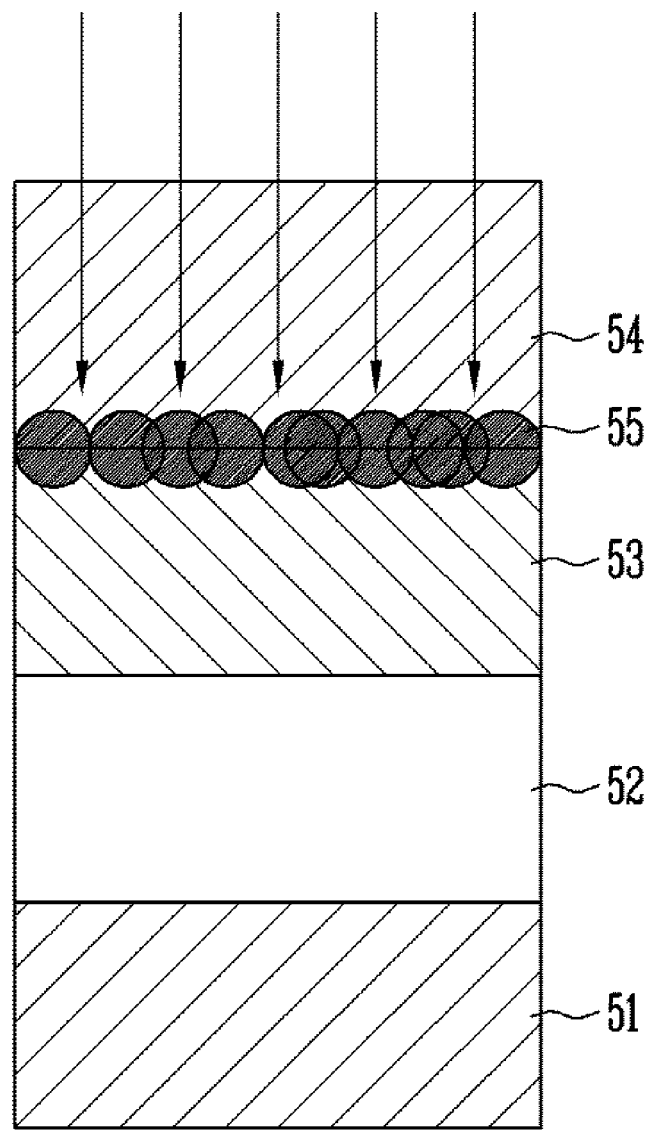
Figure 5C:
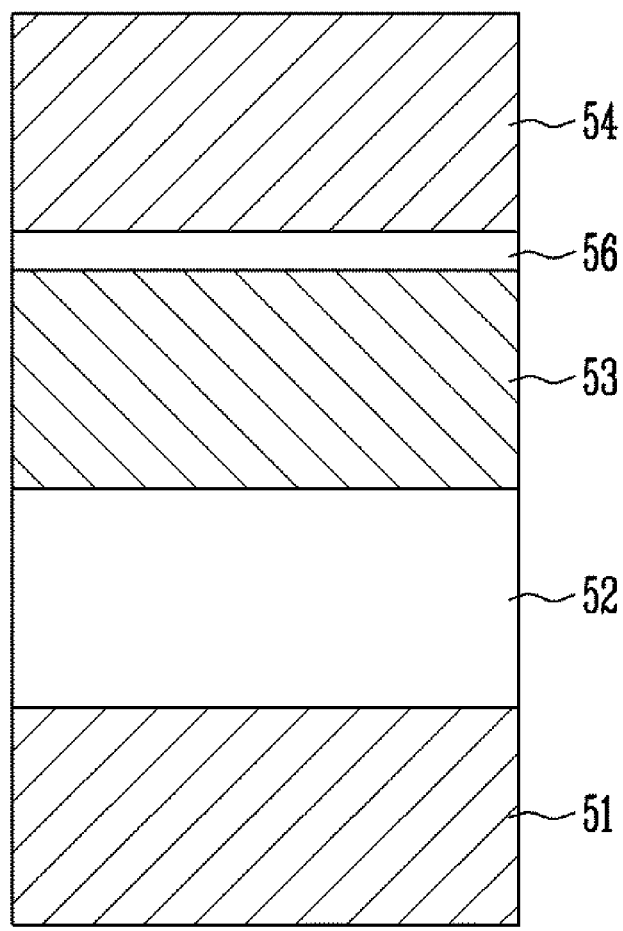

FIGS. 5A to 5C are cross-sectional views illustrating a method for fabricating the switch of FIG. 1A and the resistive memory cell of FIGS. 2A and 2B according to an embodiment of the present disclosure. Hereinafter, descriptions similar to those described above will be omitted for the interest of brevity.

Referring to FIG. 5A, a first electrode layer 51, a variable resistance layer 52, a second electrode layer 53, and a third electrode layer 54 are formed. For example, after a first electrode material layer (not shown), a variable resistance material layer (not shown), and a second electrode material layer (not shown) are formed, the first electrode material layer, the variable resistance material layer, and the second electrode material layer are patterned to form first electrode layer 51, variable resistance layer 52, and second electrode layer 53. The first electrode layer 51, the variable resistance layer 52 and the second electrode layer 53 may have the shape of a line extending in a first direction (e.g., the first direction I of FIG. 2A). Subsequently, after a third electrode material layer (not shown) is formed, at least the third electrode layer material layer is patterned to form third electrode layer 54 having the shape of a line extending in a second direction (e.g., the second direction II of FIG. 2A).

Here, the first direction and the second direction intersect each other, and may perpendicularly intersect each other.

The shapes of the variable resistance layer 52 and the second electrode layer 53 may be changed depending on an etching depth in the patterning process to form the third electrode layer 54. As an example, when only the third electrode material layer (not shown) is etched in the patterning process, the first electrode layer 51, the variable resistance layer 52, and the second electrode layer 53 may respectively have the shape of a line extending in the first direction, and the third electrode layer 54 may have the shape of a line extending in the second direction. As another example, when the third electrode material layer (not shown), the second electrode layer 53, and the variable resistance layer 52 are etched in the patterning process to form the third electrode layer 54, a second electrode pattern (not shown), and a variable resistance pattern (not shown), respectively. In this example, the first electrode layer 51 may have the shape of a line extending in the first direction, the third electrode layer 54 may have the shape of a line extending in the second direction, and the variable resistance pattern (not shown) and the second electrode pattern (not shown) may have the shape of an island located at an intersection of the first electrode layer 51 and the third electrode layer 54.

The second electrode layer 53 and the third electrode layer 54 may be formed of the same material, or may be formed of different materials. As an example, the second electrode layer 53 and the third electrode layer 54 may be formed of the same metal layer. In this case, a deposition process may be divided into sub-processes such that an interface is formed between the second electrode layer 53 and the third electrode layer 54. As another example, the second electrode layer 53 and the third electrode layer 54 may be formed of different kinds of metal layers.

Referring to FIG. 5B, in order to form a gas region (or a gas layer), ions of an element that is a gas at room temperature are implanted into the interface between the second electrode layer 53 and the third electrode layer 54. For example, hydrogen ions, helium ions, or a combination thereof are implanted at a high concentration into the interface between the second electrode layer 53 and the third electrode layer 54, using an ion implantation process. At this time, a projection range (Rp) is adjusted such that a concentration of the implanted ions has a maximum value at the interface between the second electrode layer 53 and the third electrode layer 54. For example, the Rp may be adjusted by changing implant energy in the ion implantation process. Accordingly, implanted ions 55 accumulate at the interface between the second electrode layer 53 and the third electrode layer 54.

As an example, when the second electrode layer 53 and the third electrode layer 54 are formed of the same metal material, one or more defects exist at the interface between the second electrode layer 53 and the third electrode layer 54. Therefore, in order to reduce Gibbs free energy at the interface, the implanted ions are gathered at a high concentration proximate to the defects at the interface, which is a thermodynamically unstable interface. As another example, when the second electrode layer 53 and the third electrode layer 54 are formed of different kinds of metal materials, a defect exists at the interface between the second electrode layer 53 and the third electrode layer 54. In addition, a lattice mismatch due to the different kinds of metals exists at the interface between the second electrode layer 53 and the third electrode layer 54. Here, the term "lattice mismatch" in the present disclosure may refer not only to a phenomenon where two layers having different lattice constants are brought together but also to a defect induced by the phenomenon. Therefore, the implanted ions 55 are disposed in a high concentration proximate to the defect and the lattice mismatch at the interface between the second electrode layer 53 and the third electrode layer 54.

Referring to FIG. 5C, the ions 55 accumulated at the interface between the second electrode layer 53 and the third electrode layer 54 are bonded to each other, thereby forming a gas region. Accordingly, a gas region that may include hydrogen gas, helium gas, or a mixture gas thereof is formed.

In this case, an annealing process may be performed so as to promote bonding between the ions 55. For example, a post deposition annealing (PDA) process may be performed at a temperature of 500° C. or less. Accordingly, a selecting element layer 56 including the gas region can be formed.

Figure 6A:
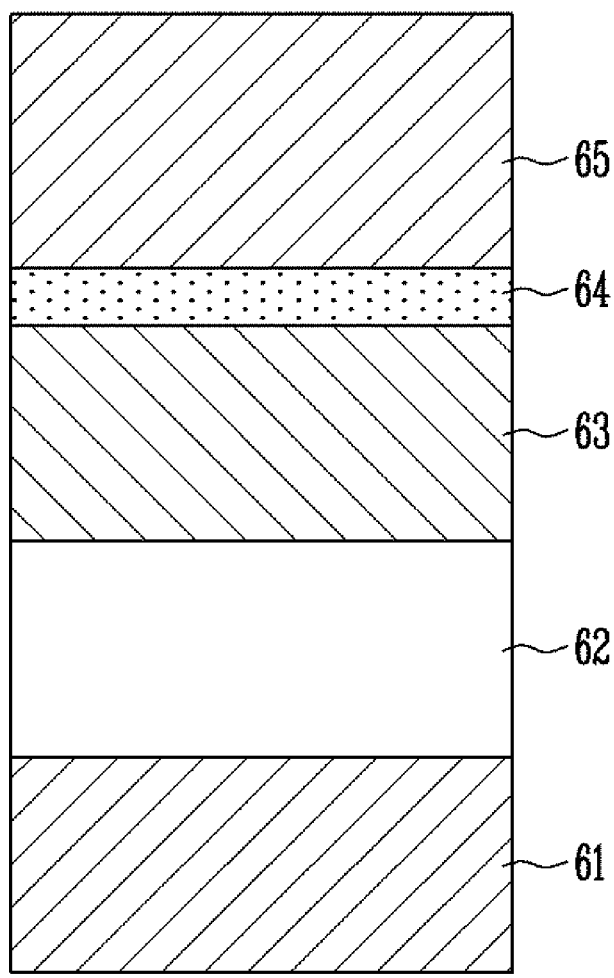
FIGS. 6A to 6C are cross-sectional views illustrating a method for fabricating the switch of FIG. 1B and the resistive memory cell of FIGS. 3A and 3B according to an embodiment of the present disclosure.
Figure 6B:
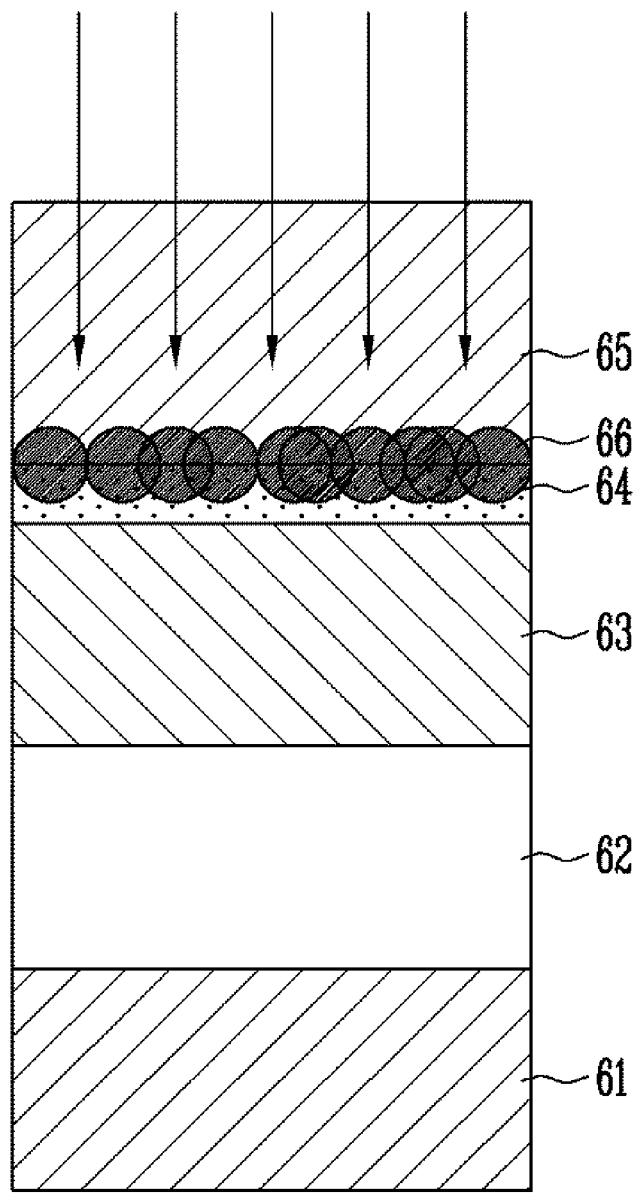
Figure 6C:
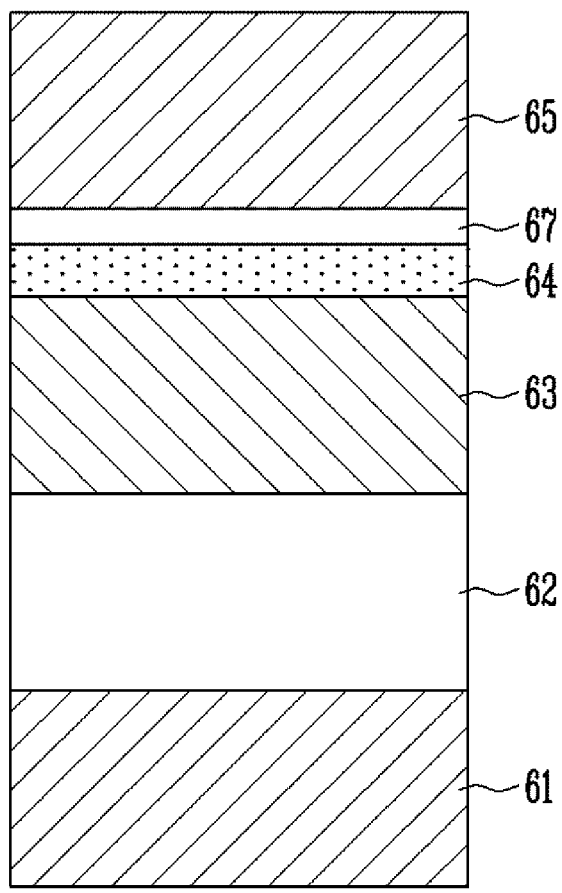

FIGS. 6A to 6C are cross-sectional views illustrating a method for fabricating the switch of FIG. 1B and the resistive memory cell of FIGS. 3A and 3B according to an embodiment of the present disclosure. Hereinafter, descriptions similar to those described above will be omitted for the interest of brevity.

Referring to FIG. 6A, a first electrode layer 61, a variable resistance layer 62, a second electrode layer 63, an insulating layer 64, and a third electrode layer 65 are formed. Here, the first electrode layer 61 may have the shape of a line extending in a first direction (e.g., the first direction I of FIG. 3A), and the third electrode layer 65 may have the shape of a line extending in a second direction (e.g., the second direction II of FIG. 3A). Also, the variable resistance layer 62, the second electrode layer 63, and the insulating layer 64 may respectively have the shape of a line extending in the first direction, or may respectively have the shape of an island located at an intersection of the first electrode layer 61 and the third electrode layer 65.

Referring to FIG. 6B, ions 66 are implanted into an interface between the insulating layer 64 and the third electrode layer 65. A defect and a lattice mismatch exist at the interface between the insulating layer 64 and the third electrode layer 65, and therefore, a high concentration of ions 66 are proximate to the defect and the lattice mismatch at the interface.

Referring to FIG. 6C, the ions 66 concentrated at the interface between the insulating layer 64 and the third electrode layer 65 are bonded to each other, thereby forming a gas region (or a gas layer) 67. In this case, after the ions 66 are implanted, an annealing process may be performed so as to promote bonding between the ions 66. Accordingly, a selecting element layer including the insulating layer 64 and the gas region 67 can be formed.

According to an embodiment of the present disclosure, a selecting element layer includes a gas region. Current flows into the gas region, or the current flowing into the gas region is substantially cut off according to a value of a voltage or a current applied to a switching device including the selecting element layer. Thus, it is possible to provide a switching device exhibiting nonlinear current-voltage behavior. Also, an off-current ($I_{off}$) can be minimized, thereby ensuring an excellent on/off ratio.

Embodiments have been disclosed herein, and although specific terms are employed, they are used and are to be interpreted in a descriptive sense and not for purpose of limitation. In some instances, features, characteristics, and/or elements described in connection with a particular embodiment may be used alone or in combination with features, characteristics, and/or elements described in connection with other embodiments, unless otherwise specifically indicated. Accordingly, it will be understood by those of skill in the art that various changes in form and details may be possible.

What is claimed is:

1. A switch comprising:
a first electrode layer having a first surface;
a second electrode layer having a second surface that faces the first surface and being disposed over the first electrode layer; and
a gas layer interposed between the first surface of the first electrode layer and the second surface of the second electrode layer, one or both of the first surface of the first electrode layer and the second surface of the second electrode layer directly contacting the gas layer,
wherein a current flows or does not flow across the gas layer according to a value of a voltage applied to the switch, and the current flows across the gas layer in an on-state, and the current does not flow across the gas layer in an off-state.

2. The switch of claim 1, wherein the gas layer is disposed at an interface between the first electrode layer and the second electrode layer, and
wherein the gas layer has a thickness sufficiently small to allow the current to flow across the gas layer by direct tunneling when the voltage is equal to or greater than a threshold value.

3. The switch of claim 1, wherein the gas layer is disposed at an interface between the first electrode layer and the second electrode layer, and
wherein the gas layer has a thickness sufficiently small to form one or more conductive filaments in the gas layer as a conductive path and to allow the current to flow through the conductive path when the voltage is equal to or greater than a threshold value, the conductive filaments including conductive ions that have been moved into the gas layer from one or both of the first electrode layer and the second electrode layer.

4. The switch of claim 1, wherein the gas layer includes one or both of hydrogen gas and helium gas.

5. The switch of claim 1, wherein the gas layer has a thickness of 10 to 200 Å.

6. The switch of claim 1, wherein the first electrode layer and the second electrode layer include different metals.

7. The switch of claim 1, wherein each of the first and second electrode layers includes one or more of titanium (Ti), titanium nitride (TiN), tungsten (W), tungsten nitride (WNx), tantalum (Ta), tantalum nitride (TaN), aluminum (Al), copper (Cu), silver (Ag), platinum (Pt), and iridium (Ir).

8. The switch of claim 1, further comprising:
an insulating layer interposed between the first electrode layer and the second electrode layer, and the gas layer is disposed at an interface between the insulating layer and the second electrode layer, and
wherein the gas layer has a thickness sufficiently small to allow the current to flow by direct tunneling when the voltage is equal to or greater than a threshold value.

9. The switch of claim 1, further comprising:
an insulating layer interposed between the first electrode layer and the second electrode layer, and the gas layer is disposed at an interface between the insulating layer and the second electrode layer, and
wherein the insulating layer has a first thickness sufficiently small to form a vacancy chain in the insulating layer when the voltage is equal to or greater than the threshold value, and the gas layer has a second thickness sufficiently small to form one or more conductive filaments in the gas layer when the voltage is equal to or greater than the threshold value, thereby generating a conductive path between the first electrode layer and the second electrode layer.

10. A resistive memory cell comprising:
a first electrode layer;
a second electrode layer having a first surface and being disposed over the first electrode layer;
a third electrode layer having a second surface that faces the first surface and being disposed over the second electrode layer;
a variable resistance layer interposed between the first electrode layer and the second electrode layer; and
a selecting element layer interposed between the second electrode layer and the third electrode layer, the selecting element layer including a gas layer disposed between the first surface of the second electrode layer and the second surface of the third electrode layer,
wherein a current flows or does not flow across the gas layer according to a voltage applied to the resistive memory cell, one or both of the first surface of the second electrode layer and the second surface of the third electrode layer directly contacting the gas layer.

11. The resistive memory cell of claim 10, wherein the gas layer is disposed at an interface between the second electrode layer and the third electrode layer,
wherein, if the voltage is less than a threshold value, the current does not flow through the selecting element layer into the variable resistance layer, and, if the voltage is equal to or greater than the threshold value, the current flows through the selecting element layer into the variable resistance layer, and
wherein the gas layer has a thickness sufficiently small to allow the current to flow by direct tunneling when the voltage is equal to or greater than the threshold value.

12. The resistive memory cell of claim 10, wherein the gas layer is disposed at an interface between the second electrode layer and the third electrode layer,
wherein, if the voltage is less than a threshold value, the current does not flow through the selecting element layer into the variable resistance layer, and, if the voltage is equal to or greater than the threshold value, the current flows through the selecting element layer into the variable resistance layer, and
wherein the gas layer has a thickness sufficiently small to form one or more conductive filaments in the gas layer as a conductive path and to allow the current to flow through the conductive path when the voltage is equal to or greater than the threshold value, the conductive filaments including conductive ions that have been moved into the gas layer from one or both of the first electrode layer and the second electrode layer.

13. The resistive memory cell of claim 10, wherein the selecting element layer further includes an insulating layer interposed between the second electrode layer and the third electrode layer, and the gas layer is located at an interface between the insulating layer and the third electrode layer,
wherein, if the voltage is less than a threshold value, the current does not flow through the selecting element layer into the variable resistance layer, and, if the voltage is equal to or greater than the threshold value, the current flows through the selecting element layer into the variable resistance layer, and
wherein the insulating layer has a first thickness sufficiently small to form a vacancy chain in the insulating layer when the voltage is equal to or greater than the threshold value, and the gas layer has a second thickness sufficiently small to form one or more conductive filaments in the gas layer when the voltage is equal to or greater than the threshold value, thereby generating a conductive path between the second electrode layer and the third electrode layer.

14. The resistive memory cell of claim 10, wherein the variable resistance layer includes one or more of a transition metal oxide, a perovskite-based material, and a chalcogenide-based material.

15. An electronic device comprising:
a memory element storing data; and
a selecting element electrically connected to the memory element, the selecting element including a gas layer interposed between a first surface of a first electrode layer and a second surface of a second electrode layer, wherein the first surface and the second surface face each other and one or both of the first surface of the first electrode layer and the second surface of the second electrode layer directly contact the gas layer,
wherein a current flows or does not flow across the gas layer according to a value of a signal applied to the electronic device, and
wherein the selecting element controls access to the memory element by preventing the current from flowing to the memory element when the value is less than a threshold value, and allowing the current to flow to the memory element when the value is equal to or greater than the threshold value.

16. The electronic device of claim 15, further comprising:
a first line extending in a first direction; and
a second line disposed over the first line, the second line extending in a second direction intersecting the first direction,
wherein the memory element and the selecting element are disposed between the first line and the second line at an intersection of the first line and the second line.

17. The electronic device of claim 16, wherein the memory element includes a third electrode layer electrically connected to the first line,
wherein the first electrode layer is electrically connected to the second line, and
wherein the second electrode layer is disposed between the first electrode layer and the third electrode layer and the memory element and the selecting element share the second electrode layer.

18. The electronic device of claim 15, wherein the gas layer is disposed at an interface between the second electrode layer and the first electrode layer.

19. The electronic device of claim 15, wherein the selecting element further includes an insulating layer interposed between the first electrode layer and the second electrode layer, and
wherein the gas layer is disposed at an interface between the insulating layer and the first electrode layer.

20. The electronic device of claim 15, wherein the gas layer has a thickness sufficiently small to form one or more conductive filaments in the gas layer as a conductive path and to allow the current to flow through the conductive path when the value is equal to or greater than the threshold value, the conductive filaments including conductive ions that have been moved into the gas layer from one or both of the first electrode layer and the second electrode layer.

21. The switch of claim 1, wherein the gas layer extends in a longitudinal direction, and the current flows in a direction perpendicular to the longitudinal direction.

22. The resistive memory cell of claim 10, wherein the second electrode layer extends in a first direction and the third electrode layer extends in a second direction perpendicular to the first direction, and wherein the current flows through a thickness of the gas layer in an on-state, the thickness of the gas layer being a length in a third direction perpendicular to a plane defined by the first and second directions.

* * * * *